US008649176B2

(12) United States Patent
Okada et al.

(10) Patent No.: US 8,649,176 B2
(45) Date of Patent: Feb. 11, 2014

(54) DISPLAY APPARATUS INCLUDING COOLING SECTION

(75) Inventors: Tomohiko Okada, Osaka (JP); Hideo Maeda, Osaka (JP); Tetsushi Ito, Osaka (JP); Hirotoshi Iemura, Osaka (JP); Kenji Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 259 days.

(21) Appl. No.: 13/208,028

(22) Filed: Aug. 11, 2011

(65) Prior Publication Data

US 2012/0044217 A1 Feb. 23, 2012

(30) Foreign Application Priority Data

Aug. 19, 2010 (JP) ................................. 2010-184453

(51) Int. Cl.
*G09G 5/00* (2006.01)
*H05K 5/00* (2006.01)
*H05K 7/20* (2006.01)

(52) U.S. Cl.
USPC ......................... 361/690; 361/679.5; 361/695

(58) Field of Classification Search
USPC .................. 361/679.49, 679.5, 690, 692–695
See application file for complete search history.

(56) References Cited

U.S. PATENT DOCUMENTS

| 7,667,964 | B2* | 2/2010 | Kang et al. ..................... 361/692 |
| 8,284,328 | B2* | 10/2012 | Shinki et al. .................. 348/790 |
| 2002/0014840 | A1* | 2/2002 | Kaneko et al. ................ 313/587 |
| 2011/0122162 | A1 | 5/2011 | Sato et al. | |

FOREIGN PATENT DOCUMENTS

| JP | 06-265855 | | 9/1994 |
| JP | 11-296094 | | 10/1999 |
| JP | 2003-173147 | | 6/2003 |
| JP | 2007-171336 | A | 7/2007 |
| JP | 2008-164802 | A | 7/2008 |
| JP | 2008-299054 | A | 12/2008 |
| WO | 2010/013307 | A1 | 2/2010 |

* cited by examiner

*Primary Examiner* — Anatoly Vortman
*Assistant Examiner* — Jacob Crum
(74) *Attorney, Agent, or Firm* — Renner, Otto, Boisselle & Sklar, LLP

(57) ABSTRACT

A display apparatus includes a display section, a control section, and a cooling section including a first ceiling section, a second ceiling section, a first connecting section and an air stream generating section. The first ceiling section is formed such that a distance of the first ceiling section from a non-display surface of the display section is shorter than that of the second ceiling section, and a ventilating area of a first ventilating passage is smaller than that of a second ventilating passage. The air stream generating section is configured such that an air stream is generated from the second ventilating passage toward the first ventilating passage so as to take the air out of the first ventilating passage and the second ventilating passage, and replenish the taken air with the ambient air. The control section is provided on a control section mounting surface of the first ceiling section.

5 Claims, 10 Drawing Sheets

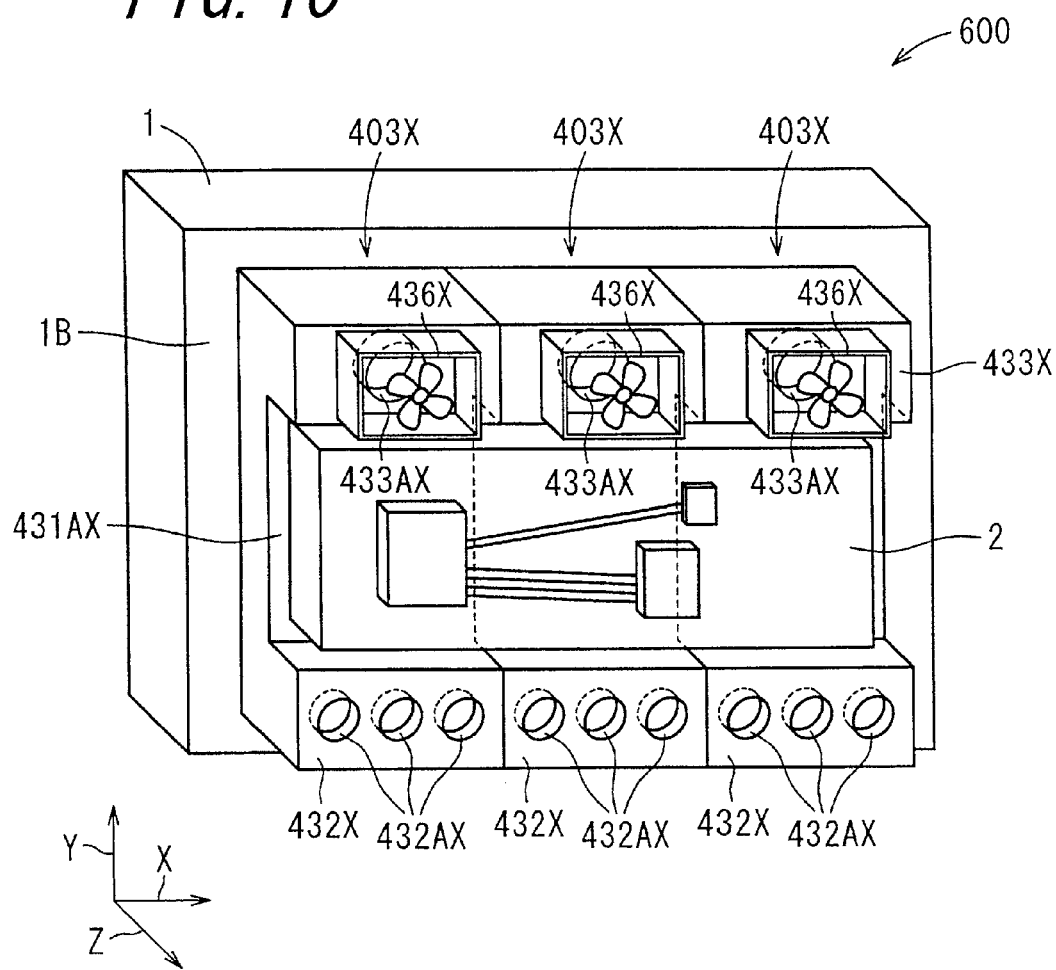

US 8,649,176 B2

DISPLAY APPARATUS INCLUDING COOLING SECTION

CROSS-REFERENCE TO RELATED APPLICATION

This application claims priority to Japanese Patent Application No. 2010-184453, which was filed on Aug. 19, 2010, the contents of which are incorporated herein by reference in its entirety.

BACKGROUND OF THE TECHNOLOGY

1. Field of the Technology

The present technology relates to a display apparatus such as a liquid crystal display apparatus and a plasma display apparatus.

2. Description of the Related Art

Display apparatuses such as a liquid crystal display apparatus and a plasma display apparatus includes a display section that displays an image, and a circuit substrate (a control section) that performs controls of display of the image displayed on the display section. The display apparatus is configured such that the display section emits light according to control by the control section and the image is displayed on a surface of the display section, so that the temperature of the display section easily rises. Thus, the air heated by the display section where the temperature is raised also raises the temperature of the control section. The control section itself generates heat when control is performed. Accordingly, it is required that a mechanism for cooling the display section and the control section is provided in the display apparatus.

In Japanese Unexamined Patent Publication JP-A 2003-173147, as a mechanism for cooling a control section, a configuration in which a cooling fan is provided and heated air around the control section is taken and replenished with ambient air is disclosed, as shown in FIG. 3 of JP-A 2003-173147.

In Japanese Unexamined Patent Publication JP-A 11-296094 (1999), as a mechanism for cooling a display section and a control section, a configuration in which a panel is provided at a back surface side of the display section with a constant gap and heated air between the back surface of the display section and the panel is taken and replenished with ambient air is disclosed, as shown in FIG. 1 of JP-A 11-296094.

In the display apparatus disclosed in JP-A 2003-173147, there is a problem that the introduced ambient air comes into direct contact with the control section so that dust and the like that are included in the ambient air are easily attached to wirings or electronic circuits in the control section. When the dust is attached to the wirings and the electronic circuits, there is a possibility that the control section will short circuit.

In the display apparatus disclosed in JP-A 11-296094, the control section is provided at a surface that is not opposite to the display section in the panel, in other words at a back surface of the panel. Accordingly, attachment of dust that is included in the ambient air to the control section is suppressed, unlike the display apparatus disclosed in JP-A 2003-173147. However, as described below, there is a problem in that it is not possible to effectively cool the control section in the configuration disclosed in JP-A 11-296094 (1999).

As described above, the control section itself generates the heat. Accordingly, in the air between the panel and the back surface of the display section, the temperature of the air near the control section rises more easily than the temperature of the air not near the control section. In the display apparatus disclosed in JP-A 11-296094 (1999), the distance between the display section and the panel is constant so that the flow speed of the air between the back surface of the display section and the panel is constant both in the air near the control section and not near the control section. Thus, the air near the control section is cannot be effectively exchanged. As a result, the control section cannot be effectively cooled.

SUMMARY OF THE TECHNOLOGY

The technology is to solve the above-described problem, and an object thereof is to provide a display apparatus capable of effectively cooling the display section and the control section while suppressing attachment of dust and the like to the control section.

The technology provides a display apparatus comprising:

a display section having a display surface that displays an image;

a control section that controls operation of the display section; and a cooling section disposed on a non-display surface opposite to the display surface in the display section, the cooling section including:

a first ceiling section provided so as to form a first ventilating passage having a predetermined ventilating area together with the non-display surface, a second ceiling section provided so as to form a second ventilating passage having a predetermined ventilating area together with the non-display surface, a connecting section provided so as to connect the first ceiling section and the second ceiling section such that the first ventilating passage and the second ventilating passage are communicated with each other, and an air stream generating section provided such that an air stream is generated from the second ventilating passage toward the first ventilating passage so as to take the air out of the first ventilating passage and the second ventilating passage, and replenish the taken air with the ambient air, the first ceiling section being provided such that a distance thereof from the non-display surface is shorter compared to the second ceiling section and the ventilating area of the first ventilating passage is smaller than the ventilating area of the second ventilating passage, and the control section being provided on a control section mounting surface of the first ceiling section that is a surface opposite to a surface facing the first ventilating passage.

The air within the first ventilating passage and the second ventilating passage is exchanged with the ambient air by the air stream generating section so that the control section is indirectly cooled. Accordingly, it is possible to suppress attachment of dust and the like that are included in the ambient air to the control section.

Also, the ventilating area of the first ventilating passage is smaller than the ventilating area of the second ventilating passage whereby the flow speed of the air within the first ventilating passage is faster than that within the second ventilating passage. Accordingly, it is possible to effectively exchange the air within the first ventilating passage with the ambient air. As a result, it is possible to effectively cool the display section and the control section.

Further, it is preferable that the cooling section has a duct structure such that an inlet port and an outlet port are formed that are opened to the ambient air respectively, a space thereof formed with the non-display surface is substantially sealed except for the inlet port and the outlet port, and the inlet port and the outlet port are formed in one surface of the cooling section respectively, and the inlet port is formed on the second ventilating passage side in the cooling section and the outlet port is formed on the first ventilating passage side in the cooling section.

The cooling section has the duct structure. Accordingly, it is possible to cool the display apparatus while increasing the strength of the entire display apparatus.

Further, it is preferable that the display apparatus comprises a plurality of the cooling sections having the duct structure, and the control section is provided over each of the control section mounting surfaces in the plurality of the cooling sections having the duct structure.

A plurality of the cooling sections having the duct structure are provided. Accordingly, it is possible to efficiently cool the display section and the control section irrespective of a placement direction of the display apparatus.

Further, it is preferable that the cooling section is configured to satisfy the following formula (1):

$$P > Q/R \qquad (1)$$

wherein a distance from the outlet port to the display section is P [cm], an opening area of the outlet port is Q [cm²], and an opening perimeter length of the outlet port is R [cm].

The cooling section is configured to satisfy the above formula (1). Accordingly, it is possible to secure a space near the outlet port and obtain a sufficient volume of air by the air stream generating section. As a result, the cooling section can cool the display section and the control section effectively.

Further, it is preferable that the cooling section is configured such that in one direction from the second ventilating passage toward the first ventilating passage, a distance between a downstream end of the display section in the one direction and a downstream end of the first ceiling section in the one direction is 0% or more and 20% or less of a length of the display section in the one direction.

The cooling section is configured such that in one direction from the second ventilating passage toward the first ventilating passage, the distance between a downstream end of the display section in the one direction and a downstream end of the first ceiling section in the one direction is 0% or more and 20% or less of the length of the display section in the one direction. Accordingly, it is possible to more effectively cool the downstream end in the one direction from the second ventilating passage toward the first ventilating passage of the display section.

BRIEF DESCRIPTION OF THE DRAWINGS

Other and further objects, features, and advantages will be more explicit from the following detailed description taken with reference to the drawings wherein:

FIG. 10 is a schematic view illustrating a display apparatus according to a sixth embodiment.

DETAILED DESCRIPTION

Figure 1:
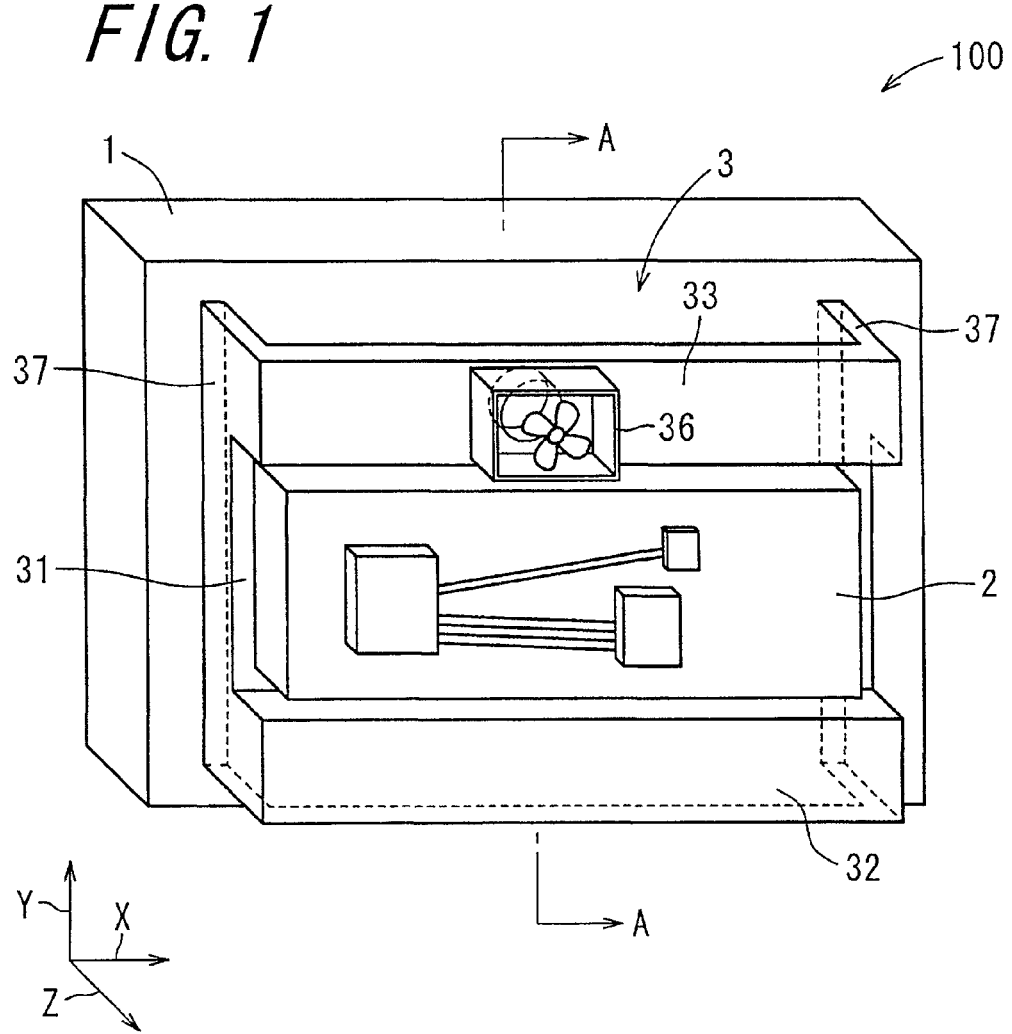
FIG. 1 is a schematic view illustrating a display apparatus according to a first embodiment.

Now referring to the drawings, preferred embodiments are described below.

Figure 2:
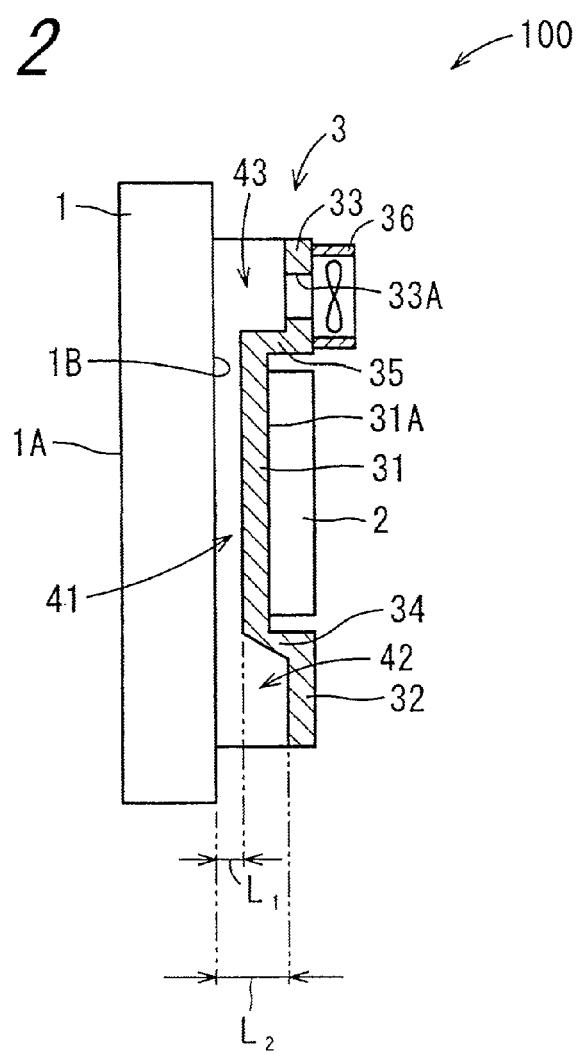
FIG. 2 is a schematic view illustrating a cross section of the display apparatus according to the first embodiment.

Hereinafter, a display apparatus 100 according to a first embodiment will be described. FIG. 1 is a schematic view illustrating the display apparatus 100. In FIG. 1, an arrow X illustrates one direction of a longitudinal direction of a display section 1 that is included in the display apparatus 100. An arrow Y illustrates one direction of a width direction of the display section 1. An arrow Z illustrates one direction of a thickness direction of the display section 1. FIG. 2 is a schematic view illustrating a cross section of the display apparatus 100. In FIG. 2, the display apparatus 100 is cut along a line A-A shown in FIG. 1. The line A-A is a line illustrating a plane that bisects the display section 1 in the direction of the arrow X.

The display apparatus 100 includes the display section 1, a control section 2 and a cooling section 3. The display section 1 has a display surface 1A that displays an image. In the display section 1, the cooling section 3 is disposed on a non-display surface 1B that is a surface opposite to the display surface 1A. The display section 1 is formed of a conventional display panel such as a liquid crystal display panel or a plasma display panel.

The control section 2 is electrically connected to the display section 1, controls the display section 1 based on data that is stored in a storage circuit within the control section 2 and causes the display surface 1A to display the image. In the embodiment, the control section 2 also controls operations of an air stream generating section 36 as described below.

The control section 2 is formed of, for example, a planar wiring substrate and an electronic circuit that is mounted on one or both sides of the wiring substrate. The cooling section 3 is provided between the non-display surface 1B and the control section 2.

The cooling section 3 includes a first ceiling section 31, a second ceiling section 32, a third ceiling section 33, a first connecting section 34, a second connecting section 35, an air stream generating section 36 and side sections 37.

The first ceiling section 31 is a member that forms a first ventilating passage 41 having a predetermined ventilating area S1 together with the non-display surface 1B. Here, the ventilating area S1 is a cross sectional area when the first ventilating passage 41 is cut in a plane that is parallel to the direction of the arrow X and the direction of the arrow Z. The first ceiling section 31 of the embodiment is a planar member provided such that a main surface thereof is parallel to the non-display surface 1B. The control section 2 is provided on a control section mounting surface 31A of the first ceiling section 31 that is a surface opposite to the surface facing the first ventilating passage 41.

The second ceiling section 32 is a member that forms a second ventilating passage 42 having a predetermined ventilating area S2 together with the non-display surface 1B. Here, the ventilating area S2 is a cross sectional area when the second ventilating passage 42 is cut in the plane that is parallel to the direction of the arrow X and the direction of the arrow Z. The second ceiling section 32 of the embodiment is a planar-shaped member provided such that a main surface thereof is parallel to the non-display surface 1B. Also, in the embodiment, the first ventilating passage 41 and the second ventilating passage 42 are configured such that their lengths in the direction of the arrow X are identical with each other.

The third ceiling section 33 is a member that forms a third ventilating passage 43 together with the non-display surface 1B. Also, in the embodiment, the first ventilating passage 41 and the third ventilating passage 43 are configured such that their length in the direction of the arrow X are identical with each other.

The third ceiling section 33 of the embodiment is a planar-shaped member provided such that a main surface thereof is parallel to the non-display surface 1B. In the third ceiling section 33, an outlet port 33A that is opened to ambient air through the air stream generating section 36 is formed. In the embodiment, the outlet port 33A is formed at one place in one surface of the cooling section 3.

The first connecting section 34 is a member that connects an upstream end of the first ceiling section 31 in the direction of the arrow Y and a downstream end of the second ceiling section 32 in the direction of the arrow Y. The first ventilating passage 41 and the second ventilating passage 42 communicate with each other through the first connecting section 34. In the embodiment, the first connecting section 34 is provided such that a surface that is adjacent to the non-display surface 1B is tilted with respect to the non-display surface 1B. Accordingly, airflow from the second ventilating passage 42 toward the first ventilating passage 41 becomes smooth.

The second connecting section 35 is a member that connects a downstream end of the first ceiling section 31 in the direction of the arrow Y and an upstream end of the third ceiling section 33 in the direction of the arrow Y. The first ventilating passage 41 and the third ventilating passage 43 communicate with each other through the second connecting section 35.

The side sections 37 are provided at both ends of the first ceiling section 31, the second ceiling section 32 and the third ceiling section 33 in the direction of the arrow X. The side sections 37 are planar-shaped members that connect both ends and the non-display surface 1B. The side sections 37 are not provided at an upstream end of the second ceiling section 32 in the direction of the arrow Y and a downstream end of the third ceiling section 33 in the direction of the arrow Y. In other words, in the embodiment, inlet ports are formed in two surfaces of the cooling section 3 so as to take in the ambient air.

The side sections 37 connect the first ceiling section 31, the second ceiling section 32 and the third ceiling section 33 to the non-display surface 1B substantially without a gap. Accordingly, a space that is formed of the first ventilating passage 41, the second ventilating passage 42 and the third ventilating passage 43 is substantially sealed except for the inlet ports at both ends of the cooling section 3 and the outlet port 33A in the direction of the arrow Y.

It is preferable that the first ceiling section 31, the second ceiling section 32, the third ceiling section 33, the first connecting section 34, the second connecting section 35 and the side sections 37 are formed of a material that has high thermal conductivity and high stiffness. For example, they may be formed of a metal material such as a carbon steel plate or an aluminum plate. If they are formed of the metal material, it is preferable that they are integrally formed of one sheet of the metal plate by bending, screwing, spot welding or the like. Accordingly, the strength of the cooling section 3 is increased.

If the first ceiling section 31 is formed of the metal material, an insulating member may be provided between the control section mounting surface 31A and the control section 2 if necessary. Examples of the insulating member include a silicone grease and a silicone sheet that have high thermal conductivity.

The air stream generating section 36 is provided downstream of the outlet port 33A in the direction of the arrow Z. The air stream generating section 36 is a device that generates an air stream from the second ventilating passage 42 toward the first ventilating passage 41 so as to take the air within the first ventilating passage 41 and the air within the second ventilating passage 42, and replenish the taken air with the ambient air. As the air stream generating section 36, an electric fan that has a shaft and blades that are connected to the shaft, and moves a fluid according to rotation of the shaft may be used.

In the embodiment, by the air stream generating section 36, the ambient air is introduced within the second ventilating passage 42 from the upstream end of the cooling section 3 in the direction of the arrow Y, and then the air within the second ventilating passage 42 moves to the first ventilating passage 41 and the third ventilating passage 43 in this order in the direction of the arrow Y, and is discharged from the outlet port 33A. Also, in the embodiment, by the air stream generating section 36, the ambient air is introduced within the third ventilating passage 43 from the downstream end of the cooling section 3 in the direction of the arrow Y, and then the air within the third ventilating passage 43 is discharged from the outlet port 33A.

As described above, according to the display apparatus 100, in the cooling section 3 that is provided between the display section 1 and the control section 2, the air within the first ventilating passage 41, the second ventilating passage 42 and the third ventilating passage 43 is exchanged with the ambient air by the air stream generating section 36. Thus, the ambient air that is introduced within the first ventilating passage 41, the second ventilating passage 42 and the third ventilating passage 43 takes heat from the non-display surface 1B, and takes heat from the control section 2 through the control section mounting surface 31A. In other words, the control section 2 is indirectly cooled by the cooling section 3. Accordingly, it is possible to suppress attachment of dust and the like that are included in the ambient air to the control section 2.

In the embodiment, the air stream generating section 36 is controlled by the control section 2. The control section 2 may drive the air stream generating section 36 simultaneously with causing the display section 1 to display the image, and may drive the air stream generating section 36 after a predetermined time has elapsed since the display section 1 is caused to display the image. Also, a temperature sensor may be provided within the first ventilating passage 41, and the control section 2 may be configured to drive the air stream generating section 36 when a temperature within the first ventilating passage 41 is equal to or higher than a predetermined temperature.

In addition to the above-described configuration, the display apparatus 100 is configured such that a distance $L_1$ from the non-display surface 1B of the first ceiling section 31 is shorter than a distance $L_2$ from the non-display surface 1B of the second ceiling section 32. The distance $L_1$ is preferably 0.5 cm or more and 1.5 cm or less, and the distance $L_2$ is preferably 1.0 cm or more and 4.0 cm or less.

The display apparatus 100 is configured such that the ventilating area S1 of the first ventilating passage 41 is smaller than the ventilating area S2 of the second ventilating passage 42. More preferably, a ratio S1/S2 that is a ratio of the ventilating area S2 of the second ventilating passage 42 with respect to the ventilating area S1 of the first ventilating passage 41 is 0.2 or more and 0.8 or less. Also, in the embodiment, since the first ventilating passage 41 and the second ventilating passage 42 are configured such that their lengths in the direction of the arrow X are identical with each other, the ratio S1/S2 is equal to $L_1/L_2$. According to the display apparatus 100, such a configuration makes it possible to effectively cool the control section 2.

Generally, the display section 1 generates heat according to displaying of the image and the control section 2 generates heat according to control thereof. Accordingly, the temperature of the first ventilating passage 41 that is a space formed between the display section 1 and the control section 2 rises more easily than that of the second ventilating passage 42. Thus, if the air within the first ventilating passage 41 is not effectively exchanged with the ambient air, the control section 2 cannot be effectively cooled.

Since the display apparatus 100 is configured such that the ventilating area S1 of the first ventilating passage 41 is smaller than the ventilating area S2 of the second ventilating passage 42, the flow speed of the air within the first ventilating passage 41 is faster than that within the second ventilating passage 42. Accordingly, it is possible to effectively exchange the air within the first ventilating passage 41 with the ambient air. As a result, it is possible to effectively cool the control section 2.

Furthermore, unlike the embodiment, if not only the ventilating area S1 but also the ventilating area S2 is small, the amount of the air that is included in the whole of the first ventilating passage 41 and the second ventilating passage 42 become small, so that the introduced ambient air reaches a thermal equilibrium within the second ventilating passage 42 or in the middle of the first ventilating passage 41. The air that reaches the thermal equilibrium is not capable of taking heat from the control section 2, so that the control section 2 is not effectively cooled.

More preferably, the display apparatus 100 includes the cooling section 3 configured to satisfy the following formula (1) wherein a distance from the outlet port 33A to the display section 1 is P [cm], an opening area of the outlet port 33A is Q [cm$^2$] and an opening perimeter length is R [cm]. Also, if the outlet port 33A is a circular shape, the opening area Q is the area of the circle and the opening perimeter length is the circumference of the circle.

$$P > Q/R \quad (1)$$

Such a configuration makes it possible to secure a space near the outlet port 33A and sufficiently obtain the volume of the air by the air stream generating section 36. As a result, the cooling section 3 can cool the display section 1 and the control section 2 more effectively.

Also, more preferably, the display apparatus 100 includes the cooling section 3 configured such that the distance in the direction of the arrow Y between the downstream end of the display section 1 in the direction of the arrow Y and the downstream end of the first ceiling section 31 in the direction of the arrow Y is 0% or more and 20% or less of the length of the display section 1 in the direction of the arrow Y. Accordingly, it is possible to more effectively cool the downstream end of the display section 1 in the direction of the arrow Y. Also, the case where the distance is 0% of the length of the display section 1 is the case where the downstream end of the display section 1 in the direction of the arrow Y and the downstream end of the first ceiling section 31 in the direction of the arrow Y are in the same position in the direction of the arrow Y.

It is preferable that the display apparatus 100 is placed such that a direction opposite to the direction of the arrow Y is aligned with the vertical direction. When the display apparatus 100 is placed as described above, the heated air between the display section 1 and the control section 2 is directed to the upper side in the vertical direction (the direction of the arrow Y) even though the air stream generating section 36 is not driven. Accordingly, when the display apparatus 100 is placed as described above, by driving the air stream generating section 36, it is possible to even more smoothly exchange the ambient air and the air between the display section 1 and the control section 2.

However, when the display apparatus 100 is placed as described above, there is a concern that the cooling efficiency of downstream side of the display section 1 in the direction of the arrow Y will be lowered compared to the case where the display apparatus 100 is placed such that the direction of the arrow Y is aligned with the vertical direction. Accordingly, as described above, it is preferable that the cooling section 3 is configured such that in the direction of the arrow Y, the distance between the downstream end of the display section 1 in the direction of the arrow Y and the downstream end of the first ceiling section 31 in the direction of the arrow Y be 0% or more and 20% or less of the length of the display section 1 in the direction of the arrow Y.

Also, it is preferable that the cooling section 3 is configured such that in the direction of the arrow Y, the distance between the upstream end of the display section 1 in the direction of the arrow Y and the upstream end of the first ceiling section 31 in the direction of the arrow Y is 5% or more and 20% or less of the length of the display section 1 in the direction of the arrow Y. Also, it is preferable that the cooling section 3 is configured such that the length of the first ventilating passage 41 in the direction of the arrow X is 50% or more and 95% or less of the length of the display section 1 in the direction of the arrow X.

Figure 3:
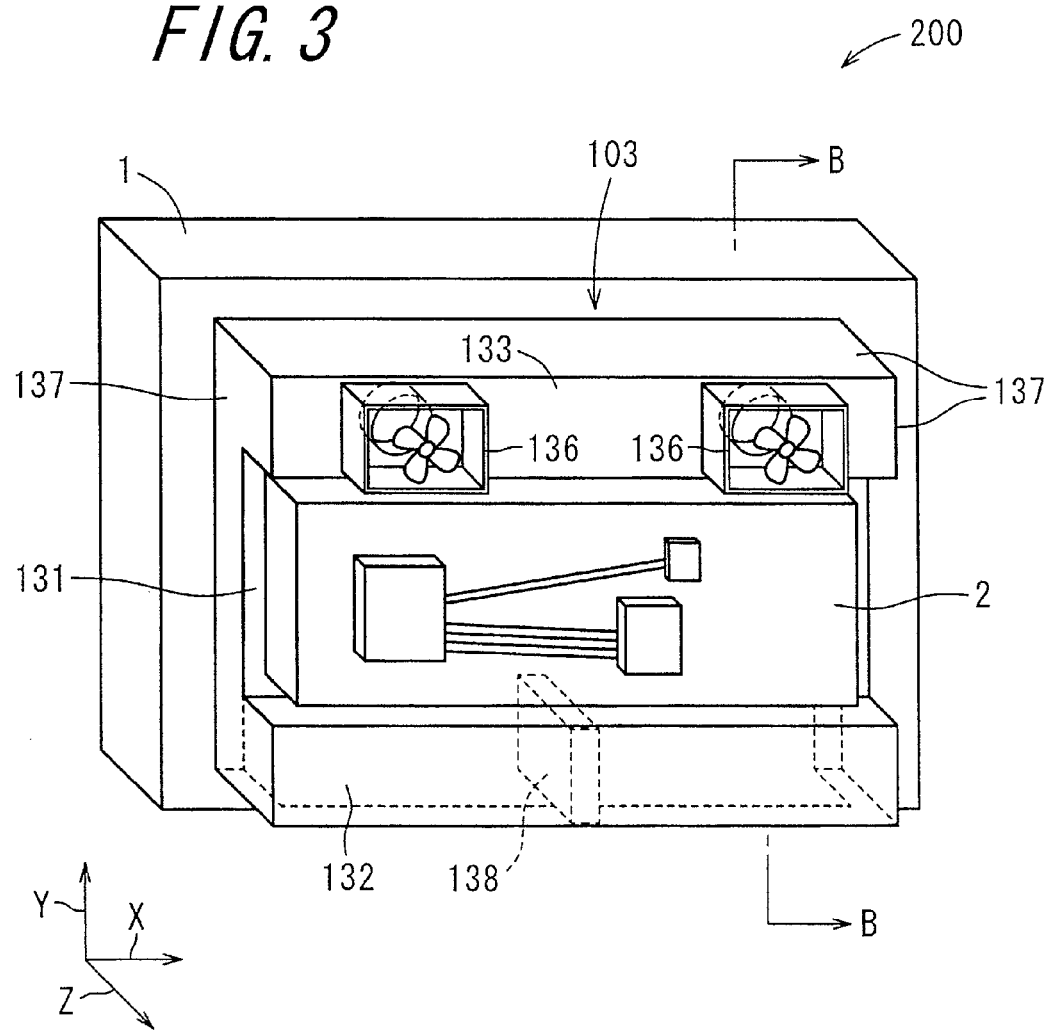
FIG. 3 is a schematic view illustrating a display apparatus according to a second embodiment.
Figure 4:
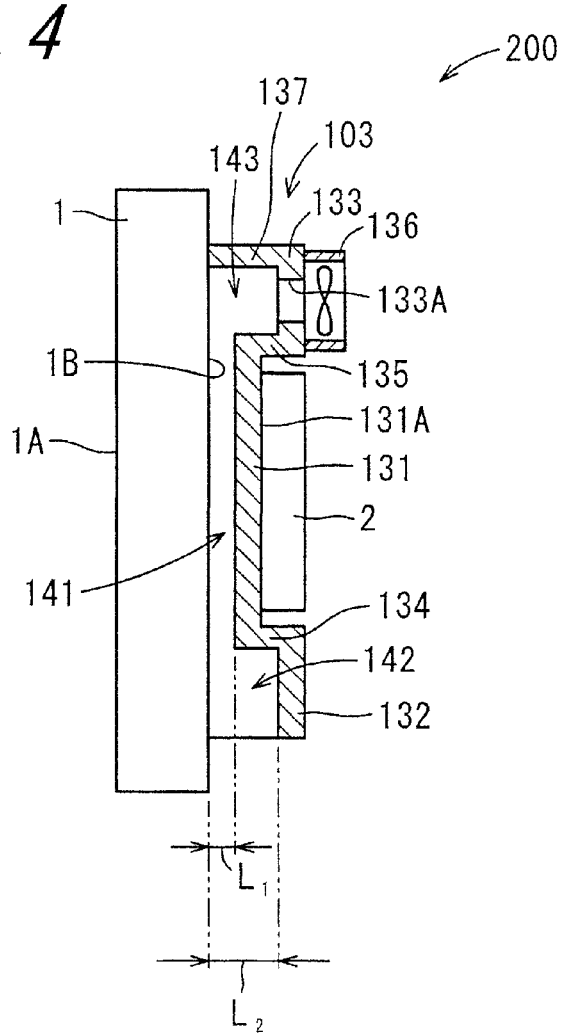
FIG. 4 is a schematic view illustrating a cross section of the display apparatus according to the second embodiment.

Next, a display apparatus 200 according to a second embodiment will be described. FIG. 3 is a schematic view illustrating the display apparatus 200. In FIG. 3, the arrow X illustrates one direction of the longitudinal direction of the display section 1 that is included in the display apparatus 200. The arrow Y illustrates one direction of the width direction of the display section 1. The arrow Z illustrates one direction of the thickness direction of the display section 1. FIG. 4 is a schematic view illustrating a cross section of the display apparatus 200. In FIG. 4, the display apparatus 200 is cut along a line B-B shown in FIG. 3. The line B-B is a line illustrating a plane that divides the display section 1 into two pairs in the direction of the arrow X.

The display apparatus 200 includes the display section 1, the control section 2 and a cooling section 103. Since the display section 1 and the control section 2 are the same as those of the first embodiment, the description thereof is omitted. The cooling section 103 includes a first ceiling section 131, a second ceiling section 132, a third ceiling section 133, a first connecting section 134, a second connecting section 135, an air stream generating section 136, side sections 137 and a reinforcing member 138.

The first ceiling section 131 is a member that forms a first ventilating passage 141 having a predetermined ventilating area S1 together with the non-display surface 1B. The first ceiling section 131 of the embodiment is a planar-shaped member provided such that a main surface thereof is parallel to the non-display surface 1B. The control section 2 is provided on a control section mounting surface 131A of the first ceiling section 131 that is a surface opposite to the surface facing the first ventilating passage 141.

The second ceiling section 132 is a member that forms a second ventilating passage 142 having a predetermined ventilating area S2 together with the non-display surface 1B. The second ceiling section 132 of the embodiment is a planar-shaped member provided such that a main surface thereof is parallel to the non-display surface 1B. Also, in the embodiment, the first ventilating passage 141 and the second ventilating passage 142 are configured such that their lengths in the direction of the arrow X are identical with each other.

The third ceiling section 133 is a member that forms a third ventilating passage 143 together with the non-display surface 1B. Also, in the embodiment, the first ventilating passage 141 and the third ventilating passage 143 are configured such that their lengths in the direction of the arrow X are identical with each other.

The third ceiling section 133 of the embodiment is a planar-shaped member provided such that a main surface thereof is parallel to the non-display surface 1B. In the third ceiling section 133, an outlet port 133A that is opened to ambient air through the air stream generating section 136 is formed. In the embodiment, the outlet port 133A is formed at two places in one surface of the cooling section 103.

The first connecting section 134 is a member that connects an upstream end of the first ceiling section 131 in the direction of the arrow Y and a downstream end of the second ceiling section 132 in the direction of the arrow Y. The first ventilating passage 141 and the second ventilating passage 142 communicate with each other through the first connecting section 134. In the embodiment, the first connecting section 134 is provided perpendicular to the main surface of the first ceiling section 131 and the main surface of the second ceiling section 132. Accordingly, the strength of the cooling section 103 is increased.

The second connecting section 135 is a member that connects a downstream end of the first ceiling section 131 in the direction of the arrow Y and an upstream end of the third ceiling section 133 in the direction of the arrow Y. The first ventilating passage 141 and the third ventilating passage 143 communicate with each other through the second connecting section 135.

The side sections 137 are planar-shaped members that connect the first ceiling section 131, the second ceiling section 132 and the third ceiling section 133, and the non-display surface 1B. The side sections 137 are provided at both ends of the first ceiling section 131, the second ceiling section 132 and the third ceiling section 133 in the direction of the arrow X, and a downstream end of the third ceiling section 133 in the direction of the arrow Y. The side section 137 is not provided at an upstream end of the second ceiling section 132 in the direction of the arrow Y. In other words, in the embodiment, an inlet port is formed in one surface of the cooling section 103 so as to take in the ambient air.

The side sections 137 connect the first ceiling section 131, the second ceiling section 132 and the third ceiling section 133 to the non-display surface 1B substantially without a gap. Accordingly, a space that is formed of the first ventilating passage 141, the second ventilating passage 142 and the third ventilating passage 143 is substantially sealed except for the inlet port at the upstream end of the cooling section 103 and the outlet port 133A in the direction of the arrow Y. In other words, the cooling section 103 of the embodiment has a duct structure.

Since the strength of the cooling section 103 having the duct structure is high, such a configuration is appropriate to increase the strength of a thin-bezel display apparatus that is used in a multi-display system. By providing the cooling section 103 on a back surface of the thin-bezel display apparatus, it is possible to cool the display apparatus while increasing the strength of the display apparatus. Also, the cooling section 103 of the embodiment has a box-shaped duct structure and the strength thereof is further increased.

The reinforcing member 138 is a planar-shaped member that connects the second ceiling section 132 and the non-display surface 1B. The reinforcing member 138 increases the strength of the cooling section 103. The reinforcing member 138 is provided at a middle position of the second ceiling section 132 in the direction of the arrow X. Accordingly, in the embodiment, inlet ports are formed at two places in one surface of the cooling section 3.

It is preferable that the first ceiling section 131, the second ceiling section 132, the third ceiling section 133, the first connecting section 134, the second connecting section 135, the side sections 137 and the reinforcing member 138 are formed of a material that has high thermal conductivity and high stiffness. For example, they may be formed of a metal material such as a carbon steel plate or an aluminum plate. If they are formed of the metal material, it is preferable that they are integrally formed of one sheet of a metal plate by bending, screwing and spot welding or the like. Accordingly, the strength of the cooling section 103 is increased.

If the first ceiling section 131 is formed of the metal material, the insulating member may be provided between the control section mounting surface 131A and the control section 2 if necessary. Examples of the insulating member include a silicone grease and a silicone sheet that have high thermal conductivity.

The air stream generating section 136 is provided downstream of the outlet port 133A in the direction of the arrow Z. The air stream generating section 136 is a device that generates an air stream from the second ventilating passage 142 toward the first ventilating passage 141 so as to take the air out of the first ventilating passage 141 and the air out of the second ventilating passage 142, and replenish them with the ambient air. In the embodiment, the ambient air is introduced within the second ventilating passage 142 from two inlet ports at the upstream end of the cooling section 103 in the direction of the arrow Y by two air stream generating sections 136. The air within the second ventilating passage 142 moves to the first ventilating passage 141 and the third ventilating passage 143 in this order in the direction of the arrow Y, and is discharged from two outlet ports 133A. As the air stream generating section 136, the electric fan that has the shaft and blades that are connected to the shaft, and moves a fluid according to rotation of the shaft may be used.

As described above, according to the display apparatus 200, in the cooling section 103 that is provided between the display section 1 and the control section 2, the air within the first ventilating passage 141, the second ventilating passage 142 and the third ventilating passage 143 is exchanged with the ambient air by the air stream generating section 136, and thus the control section 2 is cooled indirectly. Accordingly, it is possible to suppress attachment of dust and the like that are included in the ambient air to the control section 2.

In addition to the above-described configuration, the display apparatus 200 is configured such that a distance $L_1$ from the non-display surface 1B of the first ceiling section 131 is shorter than a distance $L_2$ from the non-display surface 1B of the second ceiling section 132. The distance $L_1$ is preferably 0.5 cm or more and 1.5 cm or less, and the distance $L_2$ is preferably 1.0 cm or more and 4.0 cm or less.

The display apparatus 200 is configured such that the ventilating area S1 of the first ventilating passage 141 is smaller than the ventilating area S2 of the second ventilating passage 142. More preferably, a ratio S1/S2 that is a ratio of the ventilating area S2 with respect to the ventilating area S1 is 0.2 or more and 0.8 or less. Also, in the embodiment, since the first ventilating passage 141 and the second ventilating passage 142 are configured such that their lengths in the direction of the arrow X are identical with each other, the ratio S1/S2 is equal to $L_1/L_2$.

According to the display apparatus 200, such a configuration makes it possible to effectively cool the control section 2. In other words, since the display apparatus 200 is configured such that the ventilating area S1 of the first ventilating passage 141 is smaller than the ventilating area S2 of the second ventilating passage 142, the flow speed of the air within the first ventilating passage 141 is faster than that within the second ventilating passage 142. Accordingly, it is possible to effectively exchange the air within the first ventilating passage 141 with the ambient air. As a result, it is possible to effectively cool the control section 2.

More preferably, the display apparatus 200 includes the cooling section 103 configured to satisfy the following formula (1) wherein a distance from the outlet port 133A to the display section 1 is P [cm], an opening area of the outlet port 133A is Q [cm²] and an opening perimeter length of the outlet port 133A is R [cm].

$$P > Q/R \quad (1)$$

Such a configuration makes it possible to secure a space near the outlet port 133A and sufficiently obtain the volume of the air by the air stream generating section 136. As a result, the cooling section 103 can cool the display section 1 and the control section 2 more effectively.

Also, more preferably, the display apparatus 200 includes the cooling section 103 configured such that the distance in the direction of the arrow Y between the downstream end of the display section 1 in the direction of the arrow Y and the downstream end of the first ceiling section 131 in the direction of the arrow Y is 0% or more and 20% or less of the length of the display section 1 in the direction of the arrow Y. Accordingly, it is possible to more efficiently cool the downstream end of the display section 1 in the direction of the arrow Y.

Also, it is preferable that the cooling section 103 is configured such that in the direction of the arrow Y, the distance between the upstream end of the display section 1 in the direction of the arrow Y and the upstream end of the first ceiling section 131 in the direction of the arrow Y is 5% or more and 20% or less of the length of the display section 1 in the direction of the arrow Y. Also, it is preferable that the cooling section 103 is configured such that the length of the first ventilating passage 141 in the direction of the arrow X is 50% or more and 95% or less of the length of the display section 1 in the direction of the arrow X.

Figure 5:
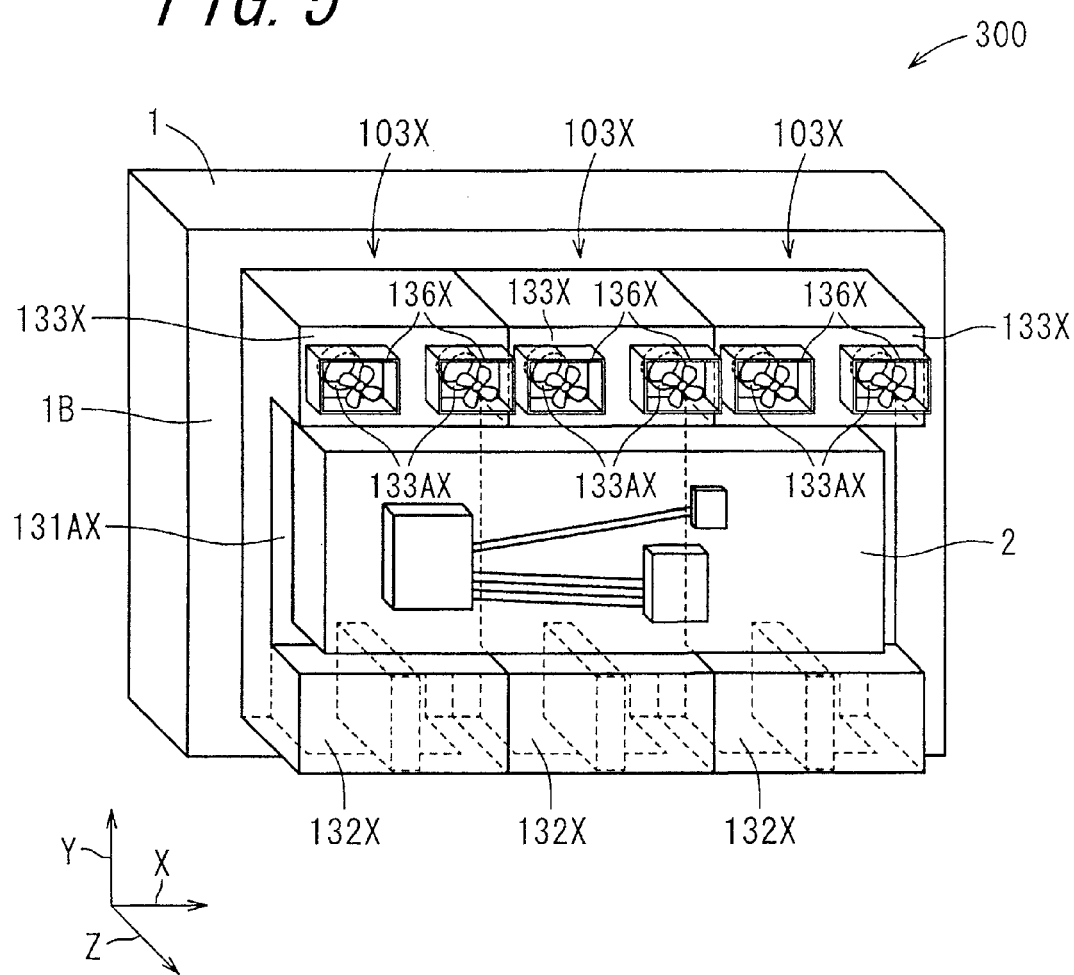
FIG. 5 is a schematic view illustrating a display apparatus according to a third embodiment.

Next, a display apparatus 300 according to a third embodiment will be described. FIG. 5 is a schematic view illustrating the display apparatus 300. In FIG. 5, the arrow X illustrates one direction of the longitudinal direction of the display section 1 that is included in the display apparatus 300. The arrow Y illustrates one direction of the width direction of the display section 1. The arrow Z illustrates one direction of the thickness direction of the display section 1. A cross sectional view of the display apparatus 300 is omitted because it is the same as that of FIG. 4.

The display apparatus 300 includes the display section 1, the control section 2 and three cooling sections 103X. Since the display section 1 and the control section 2 are the same as those of first embodiment, the description thereof is omitted. The cooling section 103X is a cooling section having the duct structure and is set to have the length of one third of the first ventilating passage 141, the second ventilating passage 142 and the third ventilating passage 143 of the cooling section 103 of the second embodiment in the direction of the arrow X. Thus, detailed description of the cooling section 103X is omitted.

Three cooling sections 103X are provided adjacent to one another such that two inlet ports are provided side by side at the upstream end of the cooling section 103X in the direction of the arrow X and two outlet ports 133AX that are formed at a third ceiling section 133X are provided side by side in the direction of the arrow X. In addition, the control section 2 is provided over each of control section mounting surfaces 131AX of three cooling sections 103X.

In the above-described embodiment, a plurality of cooling sections 103X are provided in parallel to one another and the control section 2 is provided on the plurality of cooling sections 103X. Accordingly, it is possible to effectively cool the control section 2 irrespective of a placement direction of the display apparatus 300.

For example, it is assumed that the display apparatus 200 shown in FIG. 3 is placed such that the direction of the arrow X is aligned with the vertical direction. In this case, since the heated air is directed to the upper side in the vertical direction compared to the cooled air, the moving direction (the direction of the arrow X) of the heated air and the moving direction (the direction of the arrow Y) of the air by the air stream generating section 136 are orthogonal to each other. Thus, the airflow does not become smooth and there is a concern that the air within the first ventilating passage 141 and the second ventilating passage 142 will be retained.

Meanwhile, in the embodiment, by providing the plurality of cooling sections 103X with respect to one display section 1, the ventilating area of the first ventilating passage and the ventilating area of the second ventilating passage become small in each of the cooling sections 103X and the air can be easily moved by the air stream generating section 136X. Thus, it is possible to decrease the possibility of retaining of the air. Accordingly, according to the display apparatus 300, it is possible to effectively cool the control section 2 irrespective of the placement direction of the display apparatus 300.

Also, since the plurality of cooling sections 103X having the duct structure are connected to the display section 1, the strength of the display apparatus 300 is higher compared to the display apparatuses 100 and 200.

Figure 6:
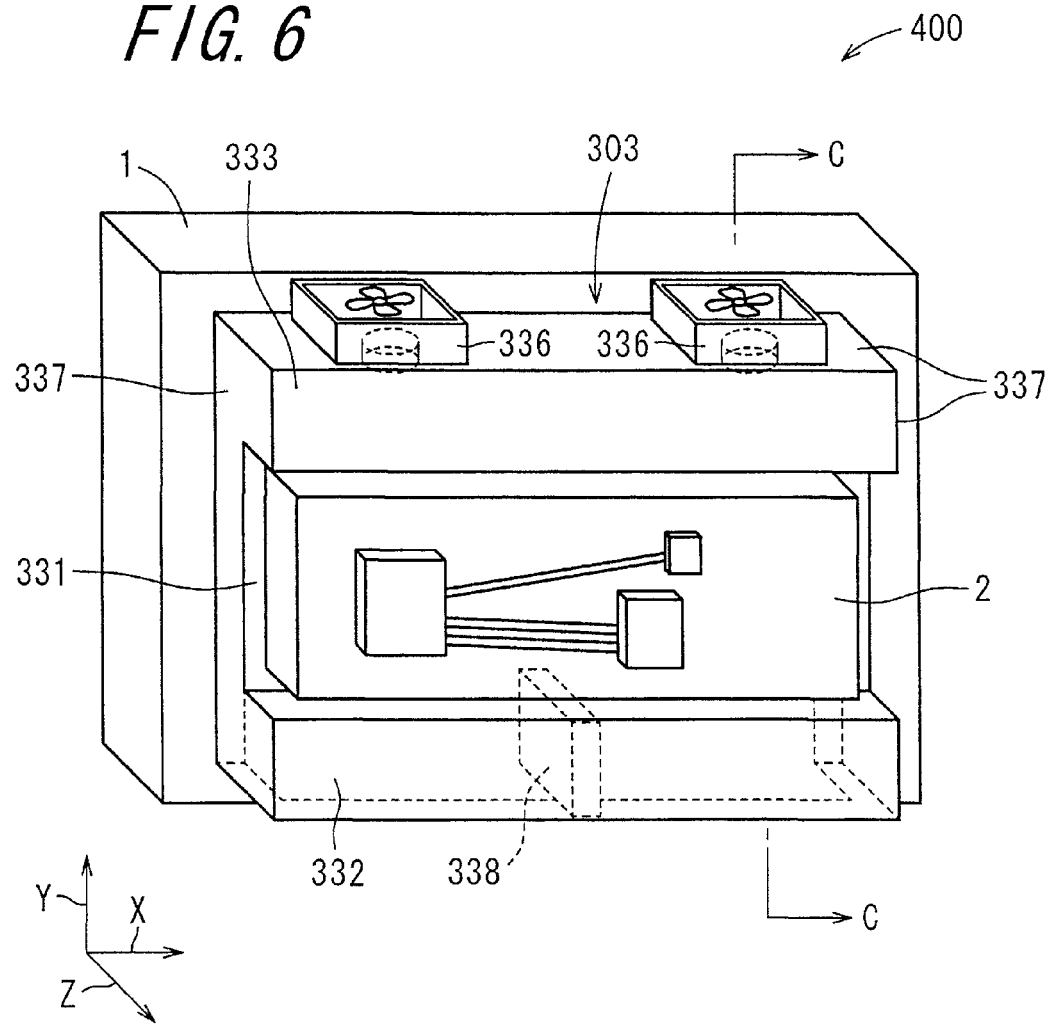
FIG. 6 is a schematic view illustrating the display apparatus according to a fourth embodiment.
Figure 7:
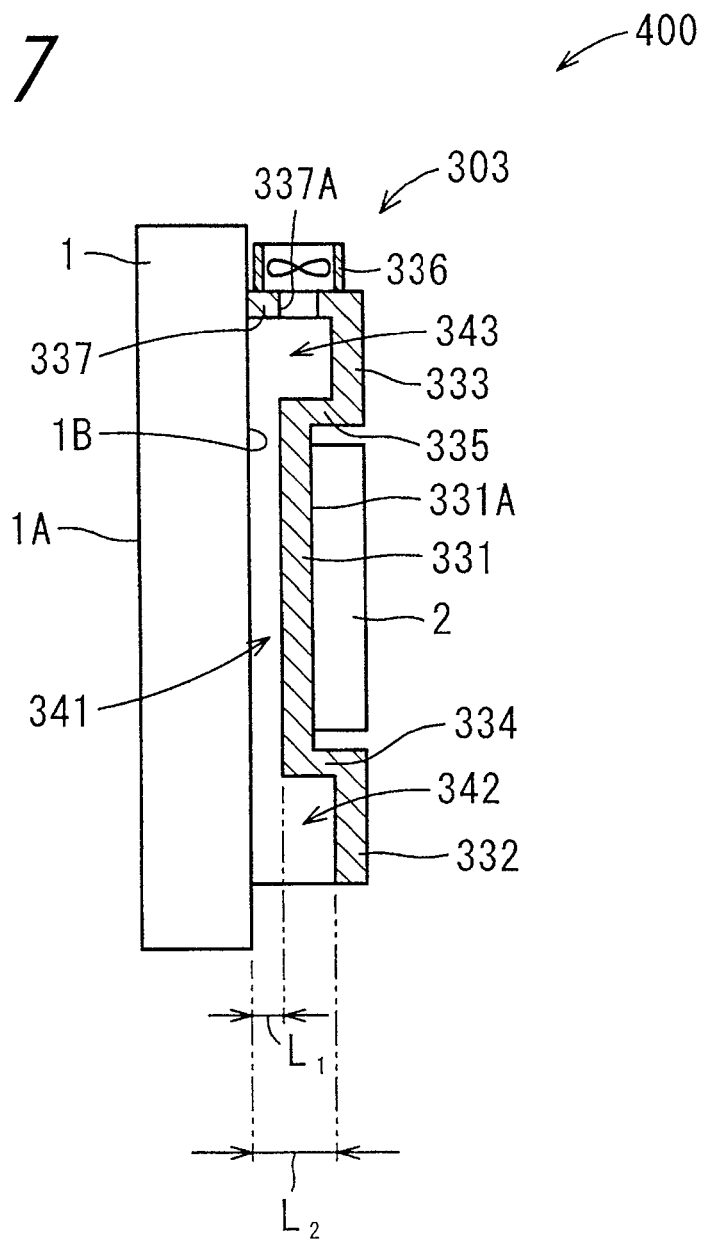
FIG. 7 is a schematic view illustrating a cross section of the display apparatus according to the fourth embodiment.

Next, a display apparatus 400 according to a fourth embodiment is described. FIG. 6 is a schematic view illustrating the display apparatus 400. In FIG. 6, the arrow X illustrates one direction of the longitudinal direction of the display section 1 that is included in the display apparatus 400. The arrow Y illustrates one direction of the width direction of the display section 1. The arrow Z illustrates one direction of the thickness direction of the display section 1. FIG. 7 is a schematic view illustrating a cross section of the display apparatus 400. In FIG. 7, the display apparatus 400 is cut along a line C-C shown in FIG. 6. The line C-C is a line illustrating a plane that divides the display section 1 into two parts in the direction of the arrow X.

The display apparatus 400 includes the display section 1, the control section 2 and a cooling section 303. Since the display section 1 and the control section 2 are the same as those of the first embodiment, the description thereof is omitted. The cooling section 303 includes a first ceiling section 331, a second ceiling section 332, a third ceiling section 333, a first connecting section 334, a second connecting section 335, an air stream generating section 336, side sections 337 and a reinforcing member 338.

The first ceiling section 331 is a member that forms a first ventilating passage 341 having a predetermined ventilating area S1 together with the non-display surface 1B. The first ceiling section 331 of the embodiment is a planar-shaped member provided such that a main surface thereof is parallel to the non-display surface 1B. The control section 2 is provided on a control section mounting surface 331A of the first ceiling section 331 that is a surface opposite to the surface facing the first ventilating passage 341.

The second ceiling section 332 is a member that forms a second ventilating passage 342 having a predetermined ventilating area S2 together with the non-display surface 1B. The second ceiling section 332 of the embodiment is a planar-shaped member provided such that a main surface thereof is parallel to the non-display surface 1B. Also, in the embodiment, the first ventilating passage 341 and the second ventilating passage 342 are configured such that their lengths in the direction of the arrow X are identical with each other.

The third ceiling section 333 is a member that forms a third ventilating passage 343 together with the non-display surface 1B. Also, in the embodiment, the first ventilating passage 341 and the third ventilating passage 343 are configured such that their lengths in the direction of the arrow X are identical with each other. The third ceiling section 333 of the embodiment is a planar-shaped member provided such that a main surface thereof is parallel to the non-display surface 1B.

The first connecting section 334 is a member that connects an upstream end of the first ceiling section 331 in the direction of the arrow Y and a downstream end of the second ceiling section 332 in the direction of the arrow Y. The first ventilating passage 341 and the second ventilating passage 342 communicate with each other through the first connecting section 334. In the embodiment, the first connecting section 334 is provided perpendicular to the main surface of the first ceiling section 331 and the main surface of the second ceiling section 332. Accordingly, the strength of the cooling section 303 is increased.

The second connecting section 335 is a member that connects a downstream end of the first ceiling section 331 in the direction of the arrow Y and an upstream end of the third ceiling section 333 in the direction of the arrow Y. The first ventilating passage 341 and the third ventilating passage 343 communicate with each other through the second connecting section 335.

The side sections 337 are planar-shaped members that connect the first ceiling section 331, the second ceiling section 332 and the third ceiling section 333, and the non-display surface 1B. The side sections 337 are provided at both ends of the first ceiling section 331, the second ceiling section 332 and the third ceiling section 333 in the direction of the arrow X, and a downstream end of the third ceiling section 333 in the direction of the arrow Y. The side section 337 is not provided at an upstream end of the second ceiling section 332 in the direction of the arrow Y. In other words, in the embodiment, an inlet port is formed in one surface of the cooling section 303 so as to take in the ambient air.

In the side section 337 that is provided at the downstream end of the third ceiling section 333 in the direction of the arrow Y, an outlet port 337A that is opened to the ambient air through the air stream generating section 336 is formed. In the embodiment, the outlet ports 337A are formed at two places in one surface of the cooling section 303.

The side sections 337 connect the first ceiling section 331, the second ceiling section 332 and the third ceiling section 333 to the non-display surface 1B substantially without a gap. Accordingly, a space that is formed of the first ventilating passage 341, the second ventilating passage 342 and the third ventilating passage 343 is substantially sealed except for the outlet port 337A and the inlet port at the upstream end of the cooling section 303 in the direction of the arrow Y. In other words, the cooling section 303 of the embodiment has a duct structure.

Since the strength of the cooling section 303 having the duct structure is high, such a configuration is appropriate to increase the strength of a thin-bezel display apparatus that is used in a multi-display system. By providing the cooling section 303 on the back surface of the thin-bezel display apparatus, it is possible cool the display apparatus while increasing the strength of the display apparatus. Also, the cooling section 303 of the embodiment has a box-shaped duct structure and the strength thereof is further increased.

The reinforcing member 338 is a planar-shaped member that connects the second ceiling section 332 and the non-display surface 1B. The reinforcing member 338 increases the strength of the cooling section 303. The reinforcing member 338 is provided at a middle position of the second ceiling section 332 in the direction of the arrow X. Accordingly, in the embodiment, inlet ports are formed at two places in one surface of the cooling section 303.

It is preferable that the first ceiling section 331, the second ceiling section 332, the third ceiling section 333, the first connecting section 334, the second connecting section 335, the side sections 337 and the reinforcing member 338 are formed of a material that has high thermal conductivity and high stiffness. For example, they are formed of a metal material such as a carbon steel plate or an aluminum plate. If they are formed of the metal material, it is preferable that they are integrally formed of one sheet of metal plate by bending, screwing and spot welding or the like. Accordingly, the strength of the cooling section 303 is increased.

If the first ceiling section 331 is formed of the metal material, the insulating member may be provided between the control section mounting surface 331A and the control section 2 if necessary. Examples of the insulating member include a silicone grease and a silicone sheet that have high thermal conductivity.

The air stream generating section 336 is provided downstream of the outlet port 337A in the direction of the arrow Y. The air stream generating section 336 is a device that generates an air stream from the second ventilating passage 342 toward the first ventilating passage 341 so as to take the air out of the first ventilating passage 341 and the air out of the second ventilating passage 342, and replenish the taken air with the ambient air. In the embodiment, the ambient air is introduced within the second ventilating passage 342 from two inlet ports at the upstream end of the cooling section 303 in the direction of the arrow Y by two air stream generating sections 336. The air within the second ventilating passage 342 moves to the first ventilating passage 341 and the third ventilating passage 343 in this order in the direction of the arrow Y, and is discharged from two outlet ports 337A. As the air stream generating section 336, the electric fan that has the shaft and blades that are connected to the shaft, and moves a fluid according to rotation of the shaft may be used.

As described above, according to the display apparatus 400, in the cooling section 303 that is provided between the display section 1 and the control section 2, the air within the first ventilating passage 341, the second ventilating passage 342 and the third ventilating passage 343 is exchanged with the ambient air by the air stream generating section 336, and thus the control section 2 is indirectly cooled. Accordingly, it is possible to suppress attachment of dust and the like that are included in the ambient air to the control section 2.

In addition to the above-described configuration, the display apparatus 400 is configured such that a distance $L_1$ from the non-display surface 1B of the first ceiling section 331 is shorter than a distance $L_2$ from the non-display surface 1B of the second ceiling section 332. The distance $L_1$ is preferably 0.5 cm or more and 1.5 cm or less, and the distance $L_2$ is preferably 1.0 cm or more and 4.0 cm or less.

The display apparatus 400 is configured such that the ventilating area S1 of the first ventilating passage 341 is smaller than the ventilating area S2 of the second ventilating passage 342. More preferably, a ratio S1/S2 that is a ratio of the ventilating area S2 of the second ventilating passage 342 with respect to the ventilating area S1 of the first ventilating passage 341 is 0.2 or more and 0.8 or less. Also, in the embodiment, since the first ventilating passage 341 and the second ventilating passage 342 are configured such that their lengths in the direction of the arrow X are identical with each other, the ratio S1/S2 is equal to $L_1/L_2$.

According to the display apparatus 400, such a configuration makes it possible to effectively cool the control section 2. In other words, since the display apparatus 400 is configured such that the ventilating area S1 of the first ventilating passage 341 is smaller than the ventilating area S2 of the second ventilating passage 342, the flow speed of the air within the first ventilating passage 341 is faster than that within the second ventilating passage 342. Accordingly, it is possible to effectively exchange the air within the first ventilating passage 341 with the ambient air. As a result, it is possible to effectively cool the control section 2.

In the embodiment, in the side section 337 that is provided at the downstream end of the third ceiling section 333 in the direction of the arrow Y, the outlet port 337A is formed. Accordingly, the air that flows from the outlet port 337A moves in the direction of the arrow Y. Thus, even though a member that is vulnerable to the heat is arranged on the cooling section 300 side of the display apparatus 400, in other words, on the back surface side of the display apparatus 400, the air having a relatively high temperature that flows from the outlet port 337A does not directly contact the member, and therefore it is possible to prevent deterioration of the member. For example, if the display apparatus 400 is provided within a house, even though a wall of the house is on the side of the back surface of the display apparatus 400, it is possible to prevent deterioration of the wall.

More preferably, the display apparatus 400 includes the cooling section 303 configured such that the distance in the direction of the arrow Y between the downstream end of the display section 1 in the direction of the arrow Y and the downstream end of the first ceiling section 331 in the direction of the arrow Y is 0% or more and 20% or less of the length of the display section 1 in the direction of the arrow Y. Accordingly, it is possible to more effectively cool the downstream end of the display section 1 in the direction of the arrow Y.

Also, it is preferable that the cooling section 303 is configured such that in the direction of the arrow Y, the distance between the upstream end of the display section 1 in the direction of the arrow Y and the upstream end of the first ceiling section 331 in the direction of the arrow Y is 5% or more and 20% or less of the length of the display section 1 in the direction of the arrow Y. Also, it is preferable that the cooling section 303 is configured such that the length of the first ventilating passage 341 in the direction of the arrow X is 50% or more and 95% or less of the length of the display section 1 in the direction of the arrow X.

Figure 8:
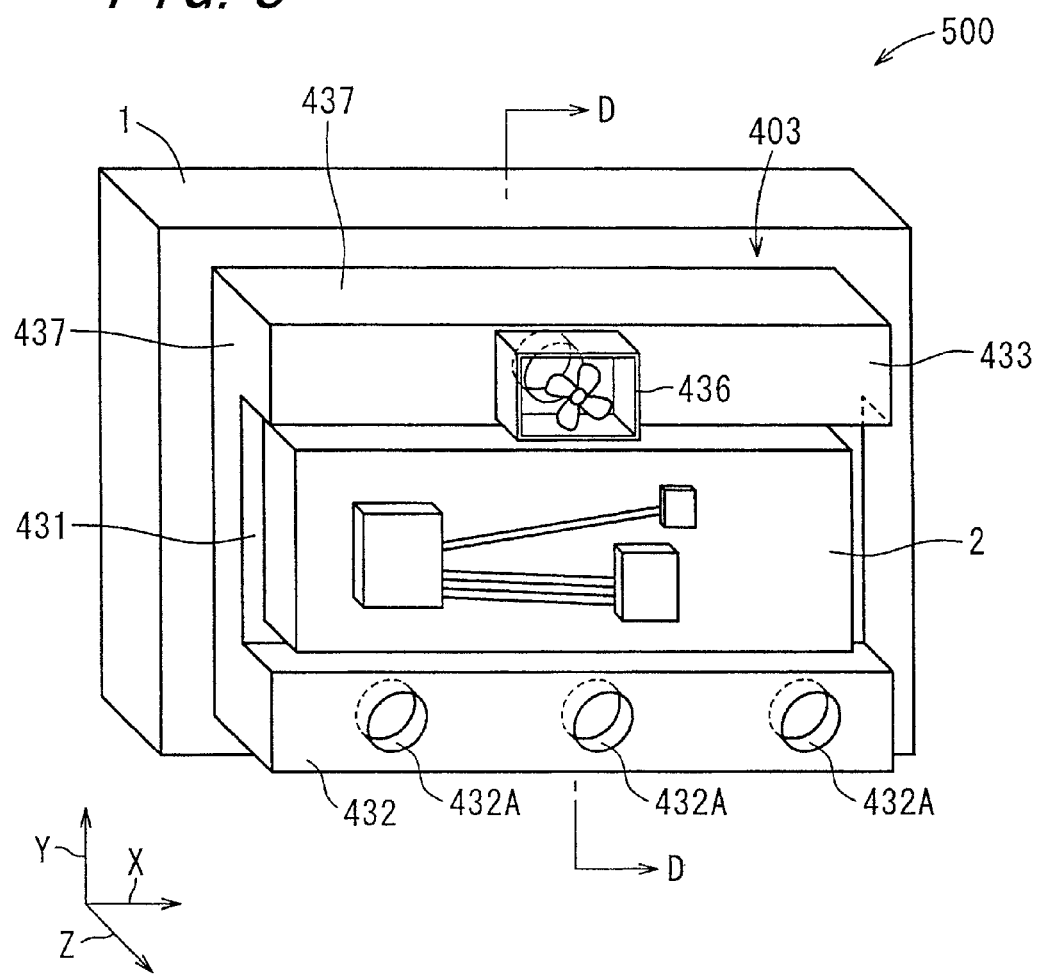
FIG. 8 is a schematic view illustrating a display apparatus according to a fifth embodiment.
Figure 9:
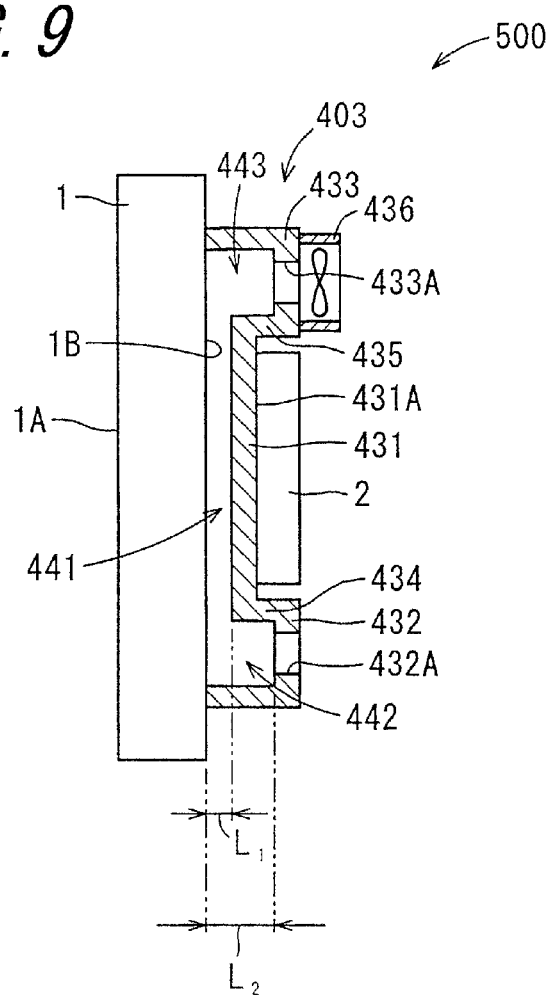
FIG. 9 is a schematic view illustrating a cross section of the display apparatus according to the fifth embodiment.

Next, a display apparatus 500 according to a fifth embodiment will be described. FIG. 8 is a schematic view illustrating the display apparatus 500. In FIG. 8, the arrow X illustrates one direction of the longitudinal direction of the display section 1 that is included in the display apparatus 500. The arrow Y illustrates one direction of the width direction of the display section 1. The arrow Z illustrates one direction of the thickness direction of the display section 1. FIG. 9 is a schematic view illustrating a cross section of the display apparatus 500. In FIG. 9, the display apparatus 500 is cut along a line D-D shown in FIG. 8. The line D-D is a line illustrating a plane that bisects the display section 1 in the direction of the arrow X.

The display apparatus 500 includes the display section 1, the control section 2 and a cooling section 403. Since the display section 1 and the control section 2 are the same as those of the first embodiment, the description thereof is omitted. The cooling section 403 includes a first ceiling section 431, a second ceiling section 432, a third ceiling section 433, a first connecting section 434, a second connecting section 435, an air stream generating section 436 and side sections 437.

The first ceiling section 431 is a member that forms a first ventilating passage 441 having a predetermined ventilating area S1 together with the non-display surface 1B. The first ceiling section 431 of the embodiment is a planar-shaped member provided such that a main surface thereof is parallel to the non-display surface 1B. The control section 2 is provided on a control section mounting surface 431A of the first ceiling section 431 that is a surface opposite to the surface facing the first ventilating passage 441.

The second ceiling section 432 is a member that forms a second ventilating passage 442 having a predetermined ventilating area S2 together with the non-display surface 1B. The second ceiling section 432 of the embodiment is a planar-shaped member provided such that a main surface thereof is parallel to the non-display surface 1B. Also, in the embodiment, the first ventilating passage 441 and the second ventilating passage 442 are configured such that their lengths in the direction of the arrow X are identical with each other.

In the second ceiling section 432, an inlet port 432A that is opened to the ambient air is formed. In the embodiment, the inlet ports 432A are formed at three places in one surface of the cooling section 403. It is preferable that the inlet port 432A is formed as large as possible.

The third ceiling section 433 is a member that forms a third ventilating passage 443 together with the non-display surface 1B. Also, in the embodiment, the first ventilating passage 441 and the third ventilating passage 443 are configured such that their lengths in the direction of the arrow X are identical with each other.

The third ceiling section 433 of the embodiment is a planar-shaped member provided such that a main surface thereof is parallel to the non-display surface 1B. In the third ceiling section 433, an outlet port 433A that is opened to the ambient air through the air stream generating section 436 is formed. In the embodiment, the outlet port 433A is formed at one place in one surface of the cooling section 403.

The first connecting section 434 is a member that connects an upstream end of the first ceiling section 431 in the direction of the arrow Y and a downstream end of the second ceiling section 432 in the direction of the arrow Y. The first ventilating passage 441 and the second ventilating passage 442 communicate with each other through the first connecting section 434. In the embodiment, the first connecting section 434 is provided perpendicular to the main surface of the first ceiling section 431 and the main surface of the second ceiling section 432. Accordingly, the strength of the cooling section 403 is increased.

The second connecting section 435 is a member that connects a downstream end of the first ceiling section 431 in the direction of the arrow Y and an upstream end of the third ceiling section 433 in the direction of the arrow Y. The first ventilating passage 441 and the third ventilating passage 443 communicate with each other through the second connecting section 435.

The side sections 437 are planar-shaped members that connect the first ceiling section 431, the second ceiling section 432 and the third ceiling section 433, and the non-display surface 1B. The side sections 437 are provided at both ends of the first ceiling section 431, the second ceiling section 432 and the third ceiling section 433 in the direction of the arrow X, an upstream end of the second ceiling section 432 in the direction of the arrow Y, and a downstream end of the third ceiling section 433 in the direction of the arrow Y. The side sections 437 connect the first ceiling section 431, the second ceiling section 432 and the third ceiling section 433 to the non-display surface 1B substantially without a gap. Accordingly, a space that is formed of the first ventilating passage 441, the second ventilating passage 442 and the third ventilating passage 443 is substantially sealed except for the inlet port 432A and the outlet port 433A. In other words, the cooling section 403 of the embodiment has a duct structure.

Since the strength of the cooling section 403 having the duct structure is high, such a configuration is appropriate to increase the strength of a thin-bezel display apparatus that is used in a multi-display system. By providing the cooling section 403 on the back surface of the thin-bezel display apparatus, it is possible to cool the display apparatus while increasing the strength of the display apparatus. Also, the cooling section 403 of the embodiment has a box-shaped duct structure and the strength thereof is further increased.

It is preferable that the first ceiling section 431, the second ceiling section 432, the third ceiling section 433, the first connecting section 434, the second connecting section 435 and the side sections 437 are formed of a material that has high thermal conductivity and high stiffness. For example, they are formed of a metal material such as a carbon steel plate or an aluminum plate. If they are formed of metal material, it is preferable that they are integrally formed of one sheet of metal plate by bending, screwing and spot welding or the like. Accordingly, the strength of the cooling section 403 is increased.

If the first ceiling section 431 is formed of the metal material, the insulating member may be provided between the control section mounting surface 431A and the control section 2 if necessary. Examples of the insulating member include a silicone grease and a silicone sheet that have high thermal conductivity.

The air stream generating section 436 is provided downstream of the outlet port 433A in the direction of the arrow Z. The air stream generating section 436 is a device that generates an air stream from the second ventilating passage 442 toward the first ventilating passage 441 so as to take the air out of the first ventilating passage 441 and the air out of the second ventilating passage 442, and replenish the taken air with the ambient air. In the embodiment, the ambient air is introduced within the second ventilating passage 442 from the inlet ports 432A by an air stream generating sections 436. The air within the second ventilating passage 442 moves to the first ventilating passage 441 and the third ventilating passage 443 in this order in the direction of the arrow Y, and is discharged from an outlet port 433A. As the air stream generating section 436, the electric fan that has the shaft and blades that are connected to the shaft, and moves a fluid according to rotation of the shaft may be used.

As described above, according to the display apparatus 500, in the cooling section 403 that is provided between the display section 1 and the control section 2, the air within the first ventilating passage 441, the second ventilating passage 442 and the third ventilating passage 443 is exchange with the ambient air by the air stream generating section 436, and thus the control section 2 is indirectly cooled. Accordingly, it is possible to suppress attachment of dust and the like that are included in the ambient air to the control section 2.

In addition to the above-described configuration, the display apparatus 500 is configured such that a distance $L_1$ from the non-display surface 1B of the first ceiling section 431 is shorter than a distance $L_2$ from the non-display surface 1B of the second ceiling section 432. The distance $L_1$ is preferably 0.5 cm or more and 1.5 cm or less, and the distance $L_2$ is preferably 1.0 cm or more and 4.0 cm or less.

The display apparatus 500 is configured such that the ventilating area S1 of the first ventilating passage 441 is smaller than the ventilating area S2 of the second ventilating passage 442. More preferably, a ratio S1/S2 that is a ratio of the ventilating area S2 of the second ventilating passage 442 with respect to the ventilating area S1 of the first ventilating passage 441 is 0.2 or more and 0.8 or less. Also, in the embodiment, since the first ventilating passage 441 and the second ventilating passage 442 are configured such that their lengths in the direction of the arrow X are identical with each other, the ratio S1/S2 is equal to $L_1/L_2$.

According to the display apparatus 500, such a configuration makes it possible to effectively cooling the control section 2. In other words, since the display apparatus 500 is configured such that the ventilating area S1 of the first ventilating passage 441 is smaller than the ventilating area S2 of the second ventilating passage 442, the flow speed of the air within the first ventilating passage 441 is faster than that within the second ventilating passage 442. Accordingly, it is possible to effectively exchange the air within the first ventilating passage 441 with the ambient air. As a result, it is possible to effectively cool the control section 2.

More preferably, the display apparatus 500 includes the cooling section 403 configured to satisfy the following formula (1) wherein a distance from the outlet port 433A to the display section 1 is P [cm], an opening area of the outlet port 433A is Q [cm$^2$] and an opening perimeter length of the outlet port 433A is R [cm].

$$P > Q/R \qquad (1)$$

Such a configuration makes it possible to secure the space near the outlet port 433A and sufficiently obtain the volume of the air by the air stream generating section 436. As a result, the cooling section 403 can cool the display section 1 and the control section 2 more effectively.

Also, more preferably, the display apparatus 500 includes the cooling section 403 configured such that the distance in the direction of the arrow Y between the downstream end of the display section 1 in the direction of the arrow Y and the downstream end of the first ceiling section 431 in the direction of the arrow Y is 0% or more and 20% or less of the length of the display section 1 in the direction of the arrow Y. Accordingly, it is possible to more effectively cool the downstream end of the display section 1 in the direction of the arrow Y.

Also, it is preferable that the cooling section 403 is configured such that in the direction of the arrow Y, the distance between the upstream end of the display section 1 in the direction of the arrow Y and the upstream end of the first ceiling section 431 in the direction of the arrow Y is 5% or more and 20% or less of the length of the display section 1 in the direction of the arrow Y. Also, it is preferable that the cooling section 403 is configured such that the length of the first ventilating passage 441 in the direction of the arrow X is 50% or more and 95% or less of the length of the display section 1 in the direction of the arrow X.

Next, a display apparatus 600 according to a sixth embodiment is described. FIG. 10 is a schematic view illustrating the display apparatus 600. In FIG. 10, the arrow X illustrates one direction of the longitudinal direction of the display section 1 that is included in the display apparatus 600. The arrow Y illustrates one direction of the width direction of the display section 1. The arrow Z illustrates one direction of the thickness direction of the display section 1. A cross sectional view of the display apparatus 600 illustrating a surface that bisects the display section 1 in the direction of the arrow X is omitted because it is the same as that of FIG. 9.

The display apparatus 600 includes the display section 1, the control section 2 and three cooling sections 403X. Since the display section 1 and the control section 2 are the same as those of first embodiment, the description thereof is omitted. The cooling section 403X is a cooling section having the duct structure and is set to have the length of one third of the first ventilating passage 441, the second ventilating passage 442 and the third ventilating passage 443 of the cooling section 403 of the fifth embodiment in the direction of the arrow X. Thus, detailed description of the cooling section 403X is omitted.

Three cooling sections 403X are provided adjacent to one another such that three inlet ports 432AX that are formed at the second ceiling section 432X are provided side by side in the direction of the arrow X and outlet ports 433AX that are formed at the third ceiling section 433X are provided side by side in the direction of the arrow X. In addition, the control section 2 is provided over each of control section mounting surfaces 431AX of three cooling sections 403X.

In the above-described embodiment, a plurality of cooling sections 403X are provided in parallel to one another and the control section 2 is provided on the plurality of cooling sections 403X. Accordingly, is it possible to effectively cool the control section 2 irrespective of a placement direction of the display apparatus 600. In the embodiment, since the plurality of cooling sections 403X are provided with respect to one display section 1, the ventilating area of the first ventilating passage and the ventilating area of the second ventilating passage become small in each of the cooling sections 403X and the air can be easily moved by the air stream generating section 436X. Thus, it is possible to decrease the possibility of retaining the air. Accordingly, according to the display apparatus 600, it is possible to effectively cool the control section 2 irrespective of the placement direction of the display apparatus 600.

Also, since the plurality of cooling sections 403X having the duct structure are connected to the display section 1, the strength of the display apparatus 600 is higher compared to the display apparatus 500.

The technology may be embodied in other specific forms without departing from the spirit or essential characteristics thereof. The present embodiments are therefore to be considered in all respects as illustrative and not restrictive, the scope of the technology being indicated by the appended claims rather than by the foregoing description and all changes which come within the meaning and the range of equivalency of the claims are therefore intended to be embraced therein.

What is claimed is:

1. A display apparatus comprising:
a display section having a display surface that displays an image;
a control section that controls operation of the display section; and
a cooling section disposed on a non-display surface opposite to the display surface in the display section, the cooling section including:
    side sections;
    a first ceiling section provided so as to form a first ventilating passage having a predetermined ventilating area together with the non-display surface and the side sections,
    a second ceiling section provided so as to form a second ventilating passage having a predetermined ventilating area together with the non-display surface and the side sections,
    a third ceiling section provided so as to form a third ventilating passage having a predetermined ventilating area together with the non-display surface and the side sections, the third ceiling section being provided such that the first ventilating passage is located between the second ventilating passage and the third ventilating passage in a first direction which is a direction from the second ventilating passage toward the first ventilating passage along the non-display surface;
    a first connecting section provided so as to connect one end of the first ceiling section in the first direction and one end of the second ceiling section in the first direction such that the first ventilating passage and the second ventilating passage are communicated with each other,
    a second connecting section provided so as to connect another end of the first ceiling section in the first direction and one end of the third ceiling section in the first direction such that the first ventilating passage and the third ventilating passage are communicated with each other, and
    an air stream generating section,
the side sections being provided upright on the non-display surface so as to support the first ceiling section, the second ceiling section, and the third ceiling section, and connecting both ends of the first ceiling section in a second direction, the both ends of the second ceiling section in the second direction, and both ends of the third ceiling section in the second direction, the second direction being a direction orthogonal to the first direction along the non-display surface,
the first ceiling section being provided such that a distance thereof from the non-display surface is shorter compared to the second ceiling section and the third ceiling section, and the ventilating area of the first ventilating passage is smaller than the ventilating area of the second ventilating passage and the ventilating area of the third ventilating passage,
a first inlet port which is an opening being formed between another end of the second ceiling section in the first direction and the non-display surface,
a second inlet port which is an opening being formed between another end of the third ceiling section in the first direction and the non-display surface,
an outlet port which is an opening being formed in the third ceiling section,
the first ceiling section, the second ceiling section, the third ceiling section, the first connecting section, the second connecting section and the side sections together with the non-display surface forming a substantially closed space which is closed excluding the first inlet port, the second inlet port and the outlet port, the air stream generating section being provided so as to face the outlet port, on an outer surface of the third ceiling section which is opposed to an inner surface of the third ceiling section facing the third ventilating passage, and being provided such that an air stream is generated from an inner surface side of the third ceiling section toward an outer surface side of the third ceiling section so as to take the air out of the substantially closed space, and replenish the taken air with the ambient air, and the control section being provided on a control section mounting surface of the first ceiling section that is a surface opposite to a surface facing the first ventilating passage.

2. The display apparatus of claim 1, wherein the cooling section has a duct structure such that the first inlet port, the second inlet port and the outlet port are formed in one surface of the cooling section respectively, and the first inlet port is formed on a second ventilating passage side in the cooling section, the second inlet port is formed on a first ventilating passage side in the cooling section with respect to the first inlet port, and the outlet port is formed on a first ventilating passage side in the cooling section with respect to the first inlet port.

3. The display apparatus of claim 2, comprising a plurality of the cooling sections having the duct structure, wherein the control section is provided over each of the control section mounting surfaces in the plurality of the cooling sections having the duct structure.

4. The display apparatus of claim 2, wherein the cooling section is configured to satisfy the following formula (1):

$$P > Q/R \qquad (1)$$

wherein a distance from the outlet port to the display section is P [cm], an opening area of the outlet port is Q [cm$^2$], and an opening perimeter length of the outlet port is R [cm].

5. The display apparatus of claim 1, wherein the cooling section is configured such that in the first direction, a distance between a front end of the display section in the first direction and a front end of the first ceiling section in the first direction is greater than 0% and less than or equal to 20% of a length of the display section in the first direction.

* * * * *